(12) United States Patent
Suemori

(10) Patent No.: US 10,707,403 B2
(45) Date of Patent: Jul. 7, 2020

(54) ELECTRONIC COMPONENT-CONTAINING MODULE

(71) Applicant: Murata Manufacturing Co., Ltd., Nagaokakyo-shi, Kyoto-fu (JP)

(72) Inventor: Yoshiharu Suemori, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 475 days.

(21) Appl. No.: 15/379,521

(22) Filed: Dec. 15, 2016

(65) Prior Publication Data

US 2017/0194552 A1 Jul. 6, 2017

Related U.S. Application Data

(63) Continuation of application No. PCT/JP2015/067123, filed on Jun. 15, 2015.

(30) Foreign Application Priority Data

Jul. 9, 2014 (JP) .................. 2014-141562

(51) Int. Cl.
*H01L 41/053* (2006.01)
*H01L 23/00* (2006.01)
(Continued)

(52) U.S. Cl.
CPC ........ *H01L 41/0533* (2013.01); *H01L 23/564* (2013.01); *H01L 41/0472* (2013.01); *H01L 41/0475* (2013.01); *H01L 41/0477* (2013.01); *H05K 3/281* (2013.01); *H05K 3/284* (2013.01); *H05K 3/3436* (2013.01); *H01L 23/3121* (2013.01); *H01L 25/16* (2013.01);
(Continued)

(58) Field of Classification Search
CPC . H01L 41/0533; H01L 41/0472; H05K 3/284; H05K 2203/1322
See application file for complete search history.

(56) References Cited

U.S. PATENT DOCUMENTS

2002/0084723 A1* 7/2002 Kawazoe ............ F02M 47/027
310/348
2002/0179289 A1* 12/2002 Yamashita .......... H01L 23/3737
165/104.33
(Continued)

FOREIGN PATENT DOCUMENTS

JP 07-226414 A 8/1995
JP 08-034608 A 2/1996
(Continued)

OTHER PUBLICATIONS

English Translation of JP 2005302835 (Year: 2005).*
Official Communication issued in corresponding International Application PCT/JP2015/067123, dated Aug. 18, 2015.

*Primary Examiner* — Bryan P Gordon
(74) *Attorney, Agent, or Firm* — Keating & Bennett, LLP

(57) ABSTRACT

An electronic component-containing module includes a board, electronic components, and a sealing resin and includes a space provided between the board and at least one of the electronic components. The dryness factor of the sealing resin is about 60% or more where, after the electronic component-containing module is moisturized, the electronic component-containing module is heated to the re-melting temperature of a brazing filler metal.

19 Claims, 7 Drawing Sheets

(51) Int. Cl.
*H05K 3/34* (2006.01)
*H05K 3/28* (2006.01)
*H01L 41/047* (2006.01)
*H01L 23/31* (2006.01)
*H01L 25/16* (2006.01)
*H05K 3/30* (2006.01)
*H03H 9/10* (2006.01)

(52) U.S. Cl.
CPC ............. *H01L 2224/131* (2013.01); *H01L 2224/16227* (2013.01); *H01L 2924/14* (2013.01); *H01L 2924/19041* (2013.01); *H01L 2924/19042* (2013.01); *H01L 2924/19043* (2013.01); *H01L 2924/19105* (2013.01); *H03H 9/1085* (2013.01); *H05K 3/303* (2013.01); *H05K 3/3442* (2013.01); *H05K 3/3494* (2013.01); *H05K 2201/1003* (2013.01); *H05K 2201/10015* (2013.01); *H05K 2201/10022* (2013.01); *H05K 2201/10068* (2013.01); *H05K 2201/10636* (2013.01); *H05K 2201/10674* (2013.01); *H05K 2203/1178* (2013.01); *H05K 2203/1311* (2013.01); *H05K 2203/1316* (2013.01); *H05K 2203/1322* (2013.01); *Y02P 70/611* (2015.11); *Y02P 70/613* (2015.11)

(56) References Cited

U.S. PATENT DOCUMENTS

| | | | |
|---|---|---|---|
| 2008/0079163 A1* | 4/2008 | Kurita | H01L 24/16 257/759 |
| 2008/0313895 A1 | 12/2008 | Higuchi et al. | |
| 2009/0179289 A1* | 7/2009 | Park | H01L 27/14627 257/432 |
| 2009/0273071 A1* | 11/2009 | Kudose | H01L 21/563 257/687 |
| 2012/0138346 A1* | 6/2012 | Uematsu | H05K 3/427 174/255 |
| 2013/0182057 A1* | 7/2013 | Koase | B41J 11/002 347/102 |
| 2014/0120662 A1* | 5/2014 | Onodera | H01L 21/563 438/108 |
| 2015/0243875 A1* | 8/2015 | Hira | H01L 41/0533 310/313 B |

FOREIGN PATENT DOCUMENTS

| | | |
|---|---|---|
| JP | 2000-063636 A | 2/2000 |
| JP | 2005-129855 A | 5/2005 |
| JP | 2005-302835 A | 10/2005 |
| JP | 2006-304145 A | 11/2006 |
| JP | 2011-219726 A | 11/2011 |
| WO | 2005/071731 A1 | 8/2005 |

* cited by examiner

ELECTRONIC COMPONENT-CONTAINING MODULE

CROSS REFERENCE TO RELATED APPLICATIONS

This application claims the benefit of priority to Japanese Patent Application No. 2014-141562 filed on Jul. 9, 2014 and is a Continuation application of PCT Application No. PCT/JP2015/067123 filed on Jun. 15, 2015. The entire contents of each application are hereby incorporated herein by reference.

BACKGROUND OF THE INVENTION

1. Field of the Invention

The present invention relates to electronic component-containing modules including boards and electronic components mounted thereon, the mounted electronic components being covered by sealing resins. The present invention particularly relates to an electronic component-containing module in which solder flash is unlikely to occur in an inner portion even though the electronic component-containing module is heated when the electronic component-containing module is mounted on a board or other substrate of an electronic device using solder or other bonding material and in which electrical shorting or electrical discontinuity is unlikely to occur.

2. Description of the Related Art

The following module is used in an electronic device or the like as a highly functional module: an electronic component-containing module having a structure in which an electronic component is mounted on a board and the mounted electronic component is covered by a sealing resin.

In such an electronic component-containing module, a space is provided between a board and a mounted electronic component in some cases as disclosed in, for example, Japanese Unexamined Patent Application Publication No. 2011-219726.

FIG. 6 shows an electronic component-containing module 300 disclosed in Japanese Unexamined Patent Application Publication No. 2011-219726.

The electronic component-containing module 300 includes a board (wiring circuit board) 201. Land electrodes, which are not shown, are provided on a principal surface of the board 201.

The electronic component-containing module 300 includes a surface acoustic wave element (a surface acoustic wave device such as, for example, a SAW filter) 202 as an electronic component. The surface acoustic wave element 202 includes a piezoelectric substrate 203. IDT electrodes (interdigital transducer electrodes) and terminal electrodes, which are not shown, for mounting are provided on a principal surface (the lower principal surface in FIG. 6) of the piezoelectric substrate 203.

The surface acoustic wave element 202 is mounted on the board 201 with bumps 204. In particular, the terminal electrodes of the surface acoustic wave element 202 are fixed to the land electrodes of the board 201 with the bumps 204.

The surface acoustic wave element 202, which is mounted on the board 201, is covered by a sealing resin 205. However, the sealing resin 205 is not filled between the board 201 and the piezoelectric substrate 203, and a space S1 is provided between the board 201 and the piezoelectric substrate 203. In the electronic component-containing module 300, the purpose of the space S1 is to avoid inhibiting the capability of the IDT electrodes of the surface acoustic wave element 202. That is, when the sealing resin 205 is in contact with the IDT electrodes, which are provided on the principal surface of the sealing resin 205, the surface acoustic wave element 202 does not function. Therefore, in the electronic component-containing module 300, the sealing resin 205 is prevented from coming into contact with the sealing resin 205 by forming the space S1. In the electronic component-containing module 300, the composition and structure of the sealing resin 205 and an additive added thereto are devised for the purpose of properly forming the space S1.

Likewise, Japanese Unexamined Patent Application Publication No. 2006-304145 and Japanese Unexamined Patent Application Publication No. 2005-129855 disclose an electronic component-containing module having a space formed between a board and an electronic component (piezoelectric substrate) for the purpose of not inhibiting the capability of a surface acoustic wave element.

On the other hand, in electronic component-containing modules, a space is provided between a board and a mounted electronic component for another purpose in some cases. For example, in an electronic component-containing module disclosed in Japanese Unexamined Patent Application Publication No. 2005-302835, a space is provided between a board and a mounted electronic component such that solder flash does not occur in an inner portion when the electronic component-containing module is mounted on a board or other substrate of an electronic device.

Solder flash is a phenomenon that solder used to bond land electrodes on a board to terminal electrodes of an electronic component in an electronic component-containing module is re-melted by heating, expands, and enters micro-cavities when the electronic component-containing module is soldered to a board or other substrate of an electronic component. Solder in a cavity causes an electrical short between terminal electrodes of an electronic component in some cases. Alternatively, in contrast, solder flows out to cause electrical discontinuity between land electrodes on a board and terminal electrodes of an electronic component in some cases.

In the electronic component-containing module disclosed in Japanese Unexamined Patent Application Publication No. 2005-302835, the space is provided between the board and the mounted electronic component, whereby the occurrence of solder flash is suppressed.

FIG. 7 shows the electronic component-containing module 400 disclosed in Japanese Unexamined Patent Application Publication No. 2005-302835.

The electronic component-containing module 400 includes a board 301. Land electrodes 302 are provided on a principal surface of the board 301.

The following components are mounted on the board 301 using the land electrodes 302: electronic components 303 each including terminal electrodes 303a formed at both ends of a component body and an electronic component 304 including a plurality of terminal electrodes (not shown) formed on the bottom surface of a component body. In particular, the terminal electrodes 303a of the electronic components 303 and the terminal electrodes of the electronic component 304 are fixed to the land electrodes 302 with solder 305.

Examples of the electronic components 303, which include the terminal electrodes 303a formed at both ends of the component body include capacitor elements, coil components, and resistance elements. Examples of the electronic component 304, which include the terminal electrodes formed on the bottom surface of the component body, include piezoelectric elements (surface acoustic wave elements or the like), semiconductor elements, and integrated circuit elements.

In the electronic component-containing module 400, the electronic components 303 and 304, which are mounted on the board 301, are covered by a film 306 made of resin.

Furthermore, the film 306, which is made of resin, is covered by a sealing resin 307.

After the sealing resin 307 is provided on the film 306 in a semi-molten state, the sealing resin 307 is solidified or is cured. Since the film 306 is present, the sealing resin 307 does not flow into cavities between the board 301 and the electronic components 303 and 304 and a space S1 is provided between the board 301 and each of the electronic components 303 and 304.

In the electronic component-containing module 400, the sealing resin 307 is not filled between the board 301 and the mounted electronic components 303 and 304 and the spaces S1 are provided therebetween. Therefore, even though the solder 305 is re-melted by heating when the electronic component-containing module is soldered to a board (not shown) or other substrate of an electronic device or the solder 305 expands in volume, the volume expansion thereof can be absorbed in the spaces S1. Thus, in the electronic component-containing module 400, solder flash is unlikely to occur. That is, the electronic component-containing module 400 includes the spaces S1 placed between the board 301 and the mounted electronic components 303 and 304 for the purpose of suppressing the occurrence of solder flash.

Incidentally, Japanese Unexamined Patent Application Publication No. 2005-302835 describes that when an electronic component contained in an electronic component-containing module is, for example, a surface acoustic wave element, providing a space between a board and the electronic component prevents the capability of the surface acoustic wave element from being inhibited by a sealing resin (refer to paragraph (0009) in Japanese Unexamined Patent Application Publication No. 2005-302835).

As disclosed in Japanese Unexamined Patent Application Publication No. 2011-219726, Japanese Unexamined Patent Application Publication No. 2006-304145, Japanese Unexamined Patent Application Publication No. 2005-129855, and Japanese Unexamined Patent Application Publication No. 2005-302835, in order not to inhibit the capability of an electronic component (for example, a surface acoustic wave element) contained in an electronic component-containing module or in order to prevent solder flash from occurring in an inner portion when the electronic component-containing module is mounted on a board or other substrate of an electronic device, a space is formed between the board and the mounted electronic component in some cases.

However, even in an electronic component-containing module including a space formed between a board and a mounted electronic component, when a sealing resin contains a liquid component (water or other liquid) in high concentration, there is a known problem that solder flash occurs in an inner portion of the electronic component-containing module because of heating when the electronic component-containing module is soldered to a board or other substrate of an electronic device, thereby causing electrical shorting or, in contrast, electrical discontinuity.

For example, paragraphs (0008) and (0009) in Japanese Unexamined Patent Application Publication No. 2006-304145 describe that when an electronic component-containing module is heated for the purpose of mounting the electronic component-containing module, solder used to mount an electronic component is re-melted in an inner portion and a liquid component (water or other liquid) contained in a sealing resin is evaporated to produce gas, resulting in the melted solder flowing into the inside of a space formed between a board and the electronic component because of the pressure difference due to the gas to cause an electrical short in some cases.

A mechanism to cause an electrical short is described below in detail with reference to drawings.

FIG. 8A shows a conventional electronic component-containing module 500.

The electronic component-containing module 500 includes a board 401 including land electrodes 402 formed on a principal surface thereof. An electronic component 403 including terminal electrodes 403a formed at both ends is mounted on the board 401. In particular, the terminal electrodes 403a of the electronic component 403 are fixed to the land electrodes 402 with solder 405. The electronic component 403, which is mounted on the board 401, is covered by a film 406 made of resin. The film 406 is covered by a sealing resin 407. In the electronic component-containing module 500, a space S1 is provided between the board 401 and the electronic component 403.

When the electronic component-containing module 500 is heated for the purpose of soldering the electronic component-containing module 500 to a board (not shown) or other substrate of an electronic device, the solder 405 is re-melted. When the sealing resin 407 contains a liquid component in high concentration, the liquid component is evaporated to produce gas.

As shown in FIG. 8B, the produced gas expands in a direction indicated by a solid arrow, flows into the inside of the film 406, and sweeps the melted solder 405 (the solder 405 on the right side in the figure) to form a space S2 in some cases. The swept solder 405 flows into the space S1 between the board 401 and the electronic component 403 to reach the opposite-side land electrode 402 (the land electrode 402 on the left side in the figure) in some cases. That is, the terminal electrodes 403a of the electronic component 403 are electrically shorted in some cases.

Since the space S2 is formed, the melted solder 405 is swept and therefore an electrical discontinuity is caused between the terminal electrodes 403a of the electronic component 403 and the land electrodes 402 in some cases.

Herein, the electronic component 403, which includes the terminal electrodes 403a formed at both ends of the component body, has been exemplified. In an electronic component including a plurality of terminal electrodes formed on the bottom surface of a component body, solder flash occurs due to a similar mechanism to cause electrical shorting or electrical discontinuity in some cases. Furthermore, the following structure has been exemplified: a structure in which the electronic component 403 is covered by the film 406, which is made of resin, and the film 406 is covered by the sealing resin 407. Even in a structure in which the film 406 is omitted and the electronic component 403 is directly covered by the sealing resin 407, solder flash occurs similarly to cause electrical shorting or electrical discontinuity in some cases.

SUMMARY OF THE INVENTION

An electronic component-containing module according to a preferred embodiment of the present invention includes a board, land electrodes provided on at least one principal surface of the board, an electronic component which includes terminal electrodes and which is mounted on the principal surface of the board such that the terminal electrodes are fixed to the land electrodes with a brazing filler metal, and a sealing resin provided on the principal surface of the board to cover the electronic component. The electronic component-containing module includes a space between the board and the electronic component. A dryness factor of the sealing resin is preferably about 60% or more where, after the electronic component-containing module is moisturized, the electronic component-containing module is heated to the re-melting temperature of the brazing filler metal.

The dryness factor of the sealing resin is preferably determined by the following method.

First, a sample that is a cube of about 7.5 mm on a side is prepared from the sealing resin. Next, the mass W1 (g) of the sample is measured. Next, after the sample was left in an environment with a temperature of about 85° C. and a humidity of about 85% for about 48 hours, the mass W2 (g) thereof is measured. The difference (W2−W1) between W2 and W1 indicates the mass of a liquid component (water) that is absorbed by the sample while the sample is left in the environment with a temperature of about 85° C. and a humidity of about 85% for about hours. Next, after the sample is heated in a temperature profile (a heating rate of about 3° C./s, holding at a preheating temperature of about 110° C. to about 200° C. for about 110 seconds) where the electronic component-containing module is heated to the re-melting temperature of the brazing filler metal (solder or other bonding material) used to fix the terminal electrodes to the land electrodes, the mass W3 (g) thereof is measured. The difference (W2−W3) between W2 and W3 indicates the mass of the liquid component (water) that is desorbed from the sample by heating the sample.

The dryness factor of the sealing resin is determined by ((W2−W3)/(W2−W1))×100(%).

Where the sealing resin used is resin with a dryness factor of about 60% or more, even if the electronic component-containing module is left under severe conditions including a temperature of about 85° C. and a humidity of about 85% for a long time (about 48 hours) and is then heated for the purpose of soldering the electronic component-containing module to a board or other substrate of an electronic device, about 60% or more of the liquid component has been desorbed from the sealing resin at the point in time when the electronic component-containing module reaches the temperature at which the inside brazing filler metal is re-melted. Thus, in the electronic component-containing module according to a preferred embodiment of the present invention, the volume of gas produced by the evaporation of the liquid component included in the sealing resin is small even though the electronic component-containing module is heated when the electronic component-containing module is soldered to a board or other substrate of an electronic device. Therefore, in the inside of the electronic component-containing module, no solder flash is caused by the liquid component included in the sealing resin and no electrical shorting or electrical discontinuity occurs.

In a preferred embodiment of the present invention, the brazing filler metal, which is used to fix the terminal electrodes to the land electrodes, may preferably be, for example, solder. Examples of the contained electronic component include capacitor elements, coil elements, resistor elements, piezoelectric elements, semiconductor elements, and integrated circuit elements. The piezoelectric elements include surface acoustic wave elements.

An electronic component-containing module according to a preferred embodiment of the present invention may preferably have a structure in which the electronic component and the board are covered by the film and the film is covered by the sealing resin. In this case, the space is readily and easily provided between the board and the electronic component.

In an electronic component-containing module according to a preferred embodiment of the present invention, the sealing resin may preferably include a filler and the content of the filler in the sealing resin may preferably be, for example, about 84% by weight or more. In this case, the sealing resin is porous and has an increased dryness factor.

In an electronic component-containing module according to a preferred embodiment of the present invention, the sealing resin includes the filler and the filler may preferably have a maximum particle size φ of about 100 μm or more, for example. In this case, the sealing resin is also porous and has an increased dryness factor.

Even though electronic component-containing modules according to various preferred embodiments of the present invention are heated when the electronic component-containing module is mounted on a board or other substrate of an electronic device using solder or other bonding material, the volume of gas produced by the evaporation of a liquid component included in a sealing resin is small. Thus, solder flash is unlikely to occur in an inner portion and electrical shorting or electrical discontinuity is unlikely to occur.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 1 shows the inside of the electronic component-containing module 100 separated from a film 6 and a sealing resin 7.

FIG. 2A shows an X-X portion in FIG. 1, and FIGS. 2B and 2C show a Y-Y portion in FIG. 1.

DETAILED DESCRIPTION OF THE PREFERRED EMBODIMENTS

Preferred embodiments of the present invention are described below with reference to drawings.

Figure 1:
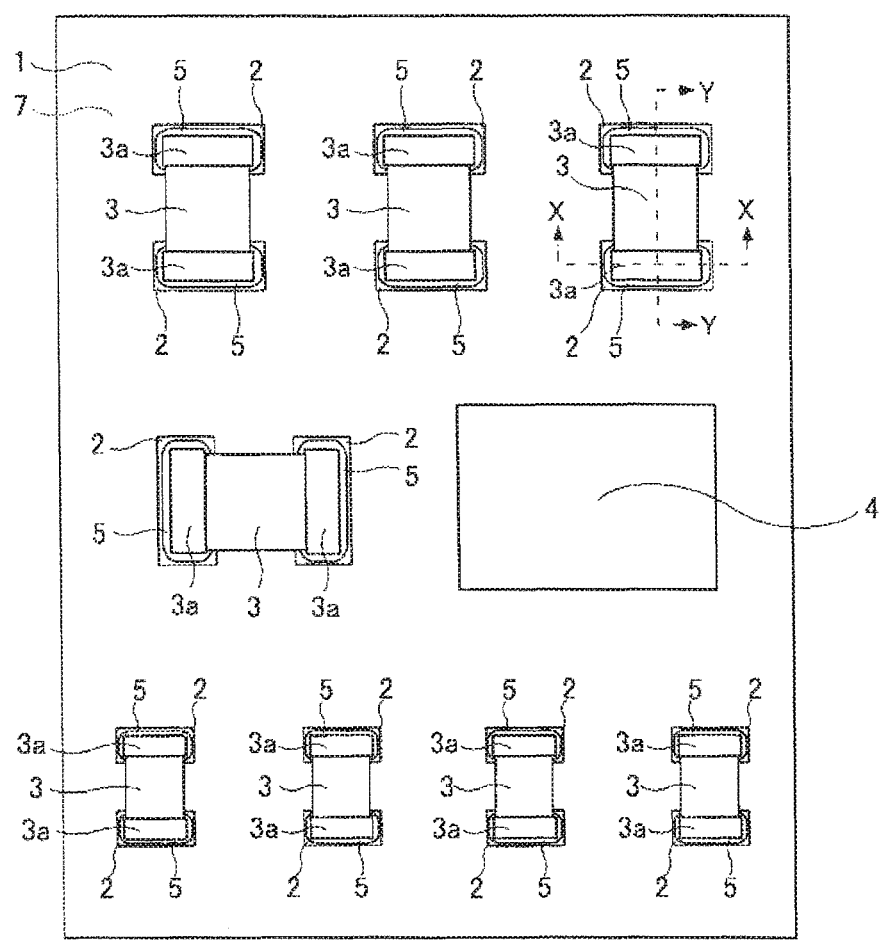
FIG. 1 is an exploded plan view of an electronic component-containing module 100 according to a preferred embodiment of the present invention.
Figure 2A:
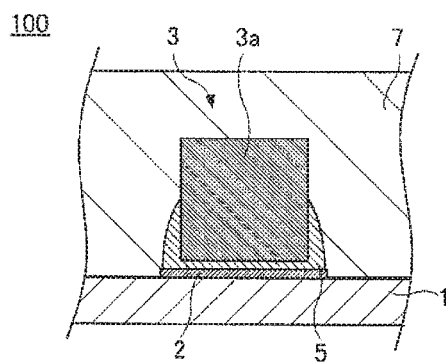
FIGS. 2A, 2B, and 2C are substantial sectional views of the electronic component-containing module 100.
Figure 2B:
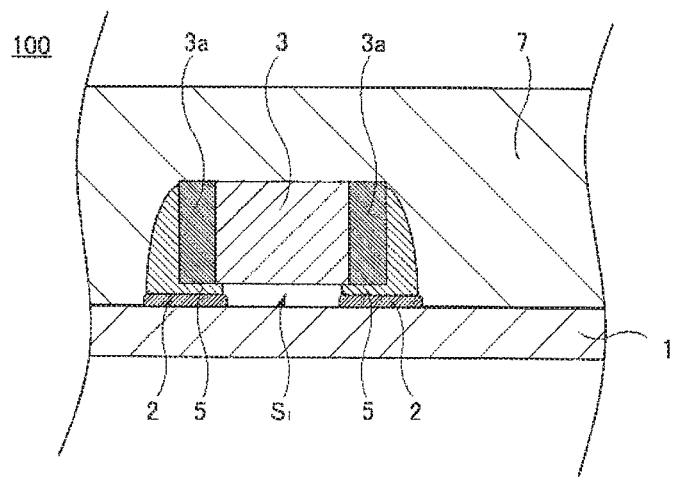

FIGS. 1, 2A, and 2B show an electronic component-containing module 100 according to a preferred embodiment of the present invention. FIG. 1 is an exploded plan view and shows the inside of the electronic component-containing module 100 separated from a sealing resin 7 below. FIGS. 2A and 2B are substantial sectional views. FIG. 2A corresponds to an X-X portion in FIG. 1. FIG. 2B corresponds to a Y-Y portion in FIG. 1.

Figure 2C:
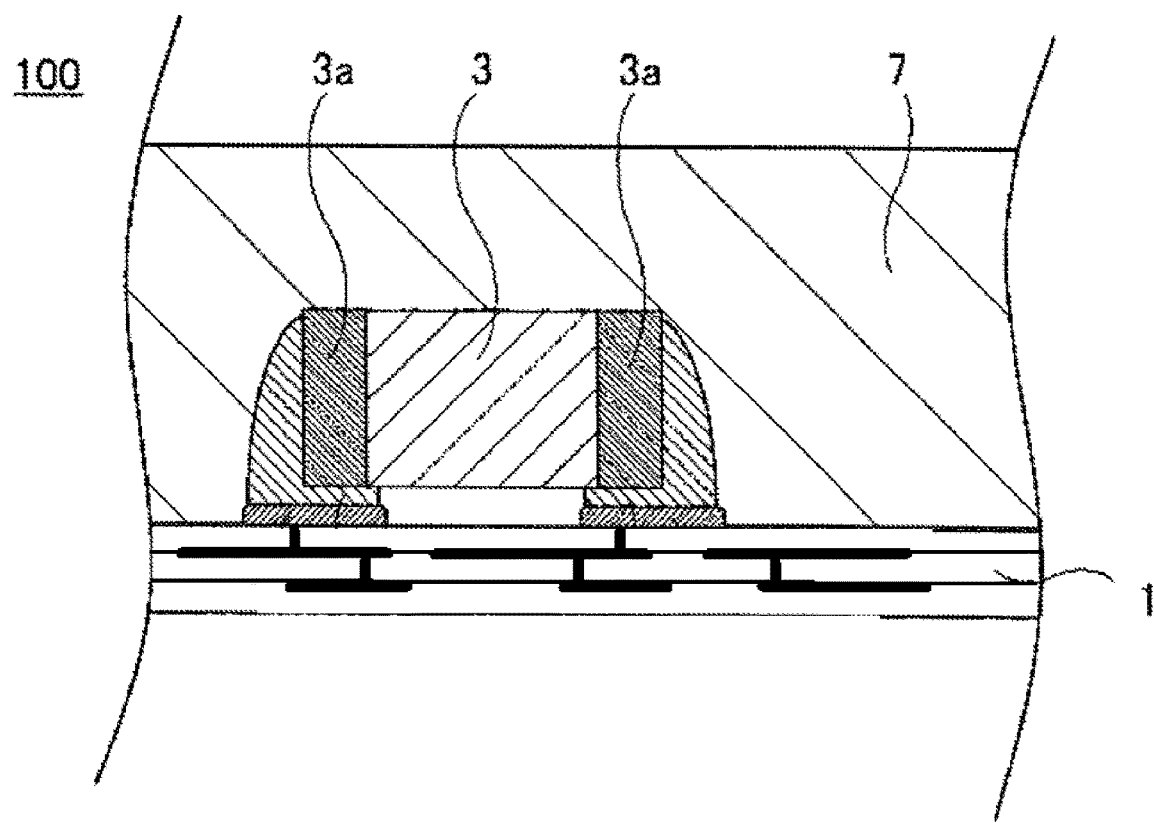

The electronic component-containing module 100 includes a board 1. The board 1 is preferably made of, for example, resin, ceramic, or other suitable material. The board 1 may have a multilayer structure as shown, for example, in FIG. 2C. The board 1 may contain an electronic component.

Land electrodes 2 are provided on a principal surface of the board 1. The land electrodes 2 are made of an arbitrary material such as, for example, copper or aluminum. Wiring electrodes, which are not shown, connecting the land electrodes 2 by being provided on a principal surface of the board 1.

The following components are mounted on the board 1 using the land electrodes 2: electronic components 3 each including terminal electrodes 3a provided at both ends of a component body and an electronic component 4 including a plurality of flip chip electrodes (not shown) provided on the bottom surface of a component body. In particular, the terminal electrodes 3a of the electronic components 3 and the flip chip electrodes of the electronic component 4 are fixed to the land electrodes 2 with a brazing filler metal, for example, solder 5.

The sealing resin 7 is structured so as to cover the electronic components 3 and 4, which are mounted on the board 1.

When the sealing resin 7 is a curable resin, the sealing resin 7 is provided on the electronic components 3 and 4 in a semi-molten state and is then cured. A space S1 is provided between the board 1 and each of the electronic components 3 and 4. The space S1 may be formed such that when the semi-molten sealing resin 7 is provided, the temperature or melting condition of the sealing resin 7, the magnitude of the pressure pressing the sealing resin 7 in a direction of the board 1, the rate of pressing the sealing resin 7, and/or other conditions may be adjusted.

The sealing resin 7 is preferably a resin with a dryness factor of about 60% or more, for example. A method for measuring the dryness factor is described above. The sealing resin 7 is an arbitrary material and may be, for example, a curable resin, such as an epoxy resin or a polyimide resin.

The sealing resin 7 preferably contains a filler. The content of the filler in the sealing resin 7 is preferably about 84% by weight or more, for example. This is to provide a sealing resin 7 that is porous and has an increased dryness factor.

The filler preferably has a maximum particle size φ of about 100 μm or more, for example. This is also to provide a sealing resin 7 that is porous and has an increased dryness factor.

Since the sealing resin 7 is a resin with a dryness factor of about 60% or more, the volume of gas produced by the evaporation of a liquid component included in the sealing resin 7 is small even though the electronic component-containing module 100 is heated when the electronic component-containing module 100 is mounted on a board or other substrate of an electronic device using solder or other bonding material. Therefore, in an inner portion thereof, no solder flash occurs or no electrical shorting or electrical discontinuity occurs.

Before the electronic component-containing module 100 is used, the liquid component remains in the sealing resin 7 or the sealing resin 7 absorbs the liquid component during manufacture or storage. Even if the liquid component remains in the sealing resin 7 during manufacture or the sealing resin 7 absorbs the liquid component during storage, no electrical shorting or electrical discontinuity occurs in an inner portion when the electronic component-containing module 100 according to a preferred embodiment is soldered to a board or other substrate of an electronic device.

The electronic component-containing module 100 according to a preferred embodiment can be manufactured through, for example, steps shown in FIGS. 3A, 3B, 4A, and 4B so.

Figure 3A:
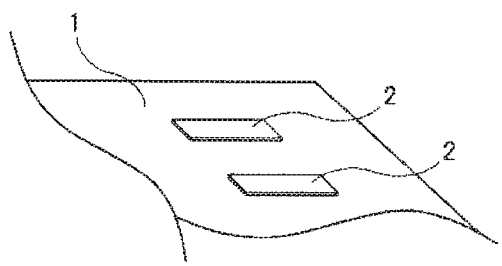
FIGS. 3A and 3B are perspective views showing steps performed in an example of a method for manufacturing the electronic component-containing module 100.

First, as shown in FIG. 3A, the land electrodes 2 are formed on the board 1. The land electrodes 2 can be formed such that, for example, copper foil is attached over a principal surface of the board 1 and is etched into a desired shape.

Figure 3B:
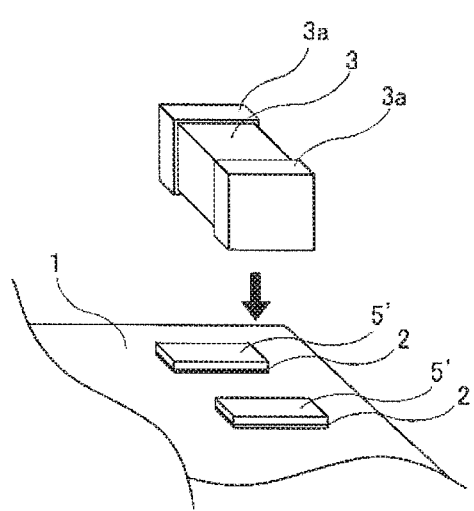

Next, as shown in FIG. 3B, a solder paste 5' is applied to the land electrodes 2 and the electronic components 3, which include the terminal electrodes 3a formed at both ends of the component body, are then preliminarily fixed on the land electrodes 2. Likewise, the electronic component 4, which includes the flip chip electrodes formed on the bottom surface of the component body, is preliminarily fixed on the land electrodes 2 having the solder paste 5' applied thereto, which is not shown.

Figure 4A:
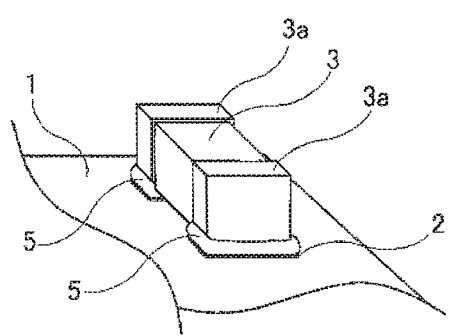
FIGS. 4A and 4B are subsequent to FIG. 3B and are perspective views showing steps performed in an example of the method for manufacturing the electronic component-containing module 100.

Next, as shown in FIG. 4A, the solder paste 5' is melted and is subsequently solidified by cooling, such that the terminal electrodes 3a of the electronic components 3 are fixed to the land electrodes 2 with the solder 5. Likewise, the flip chip electrodes of the electronic component 4 are fixed to the land electrodes 2 with the solder 5, which is not shown.

Figure 4B:
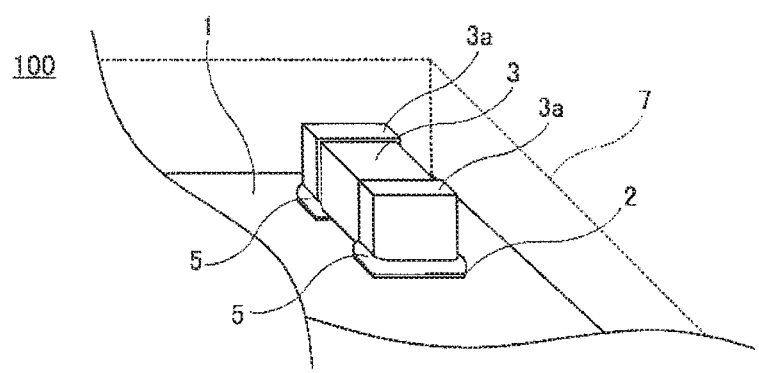

Next, as shown in FIG. 4B, the board 1 and the electronic components 3 and 4, which are mounted on the board 1, are covered with the sealing resin 7, such that the electronic component-containing module 100 according to a preferred embodiment of the present invention is produced. When the sealing resin 7 is, for example, a curable resin, a step of covering the electronic components 3 and 4 with the sealing resin 7 is performed such that the semi-molten sealing resin 7 is provided on the electronic components 3 and 4, the lower surface thereof is deformed to follow the shapes of the electronic components 3 and 4, the upper surface thereof is flattened, and the sealing resin 7 is then cured by a process, such as heat curing or light curing, for example.

The structure of the electronic component-containing module 100 according to a preferred embodiment of the present invention and an example of the method for manufacturing the same have been described above. However, contents of the present invention are not limited to these. Various modifications can be made without departing from the spirit of the present invention.

Figure 5:
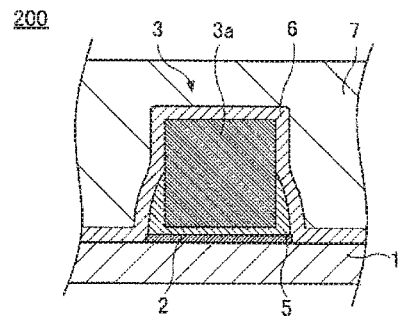
FIGS. 5A and 5B are substantial sectional views of an electronic component-containing module 200 according to a modification of a preferred embodiment of the present invention.
Figure 5B:
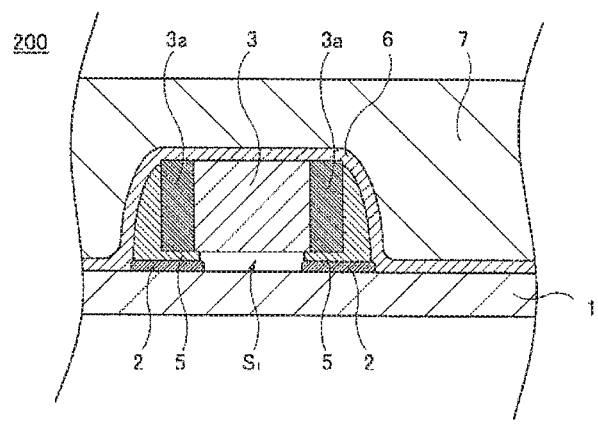
Figure 6:
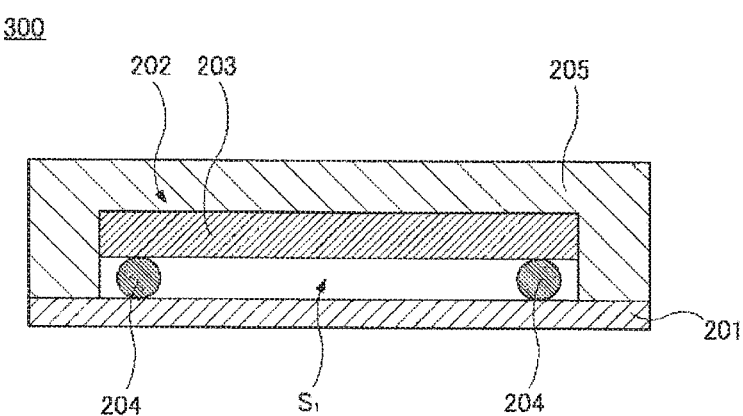
FIG. 6 is a sectional view of a conventional electronic component-containing module 300 disclosed in Japanese Unexamined Patent Application Publication No. 2011-219726.
Figure 7:
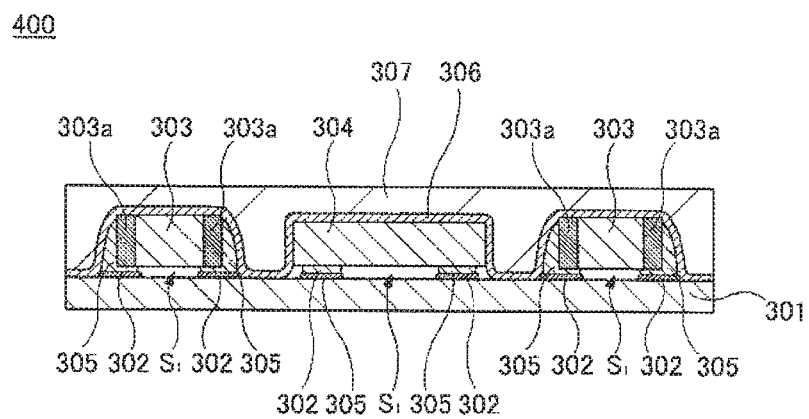
FIG. 7 is a sectional view of a conventional electronic component-containing module 400 disclosed in Japanese Unexamined Patent Application Publication No. 2005-302835.
Figure 8A:
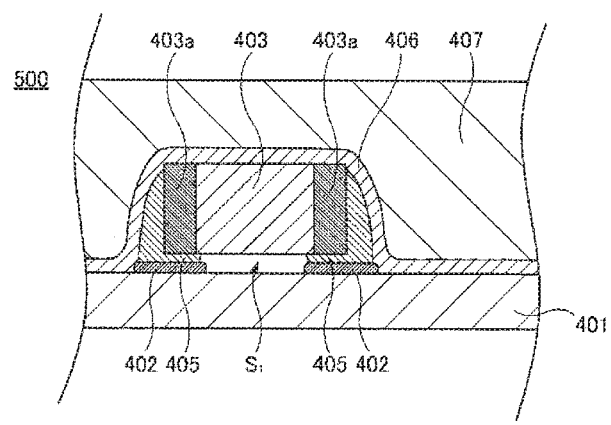
FIGS. 8A and 8B are substantial sectional views showing a state in which a liquid component included in a sealing resin is evaporated by heating to produce gas and therefore terminal electrodes of an electronic component are electrically shorted when a conventional electronic component-containing module 500 is soldered to a board or other substrate of an electronic device.
Figure 8B:
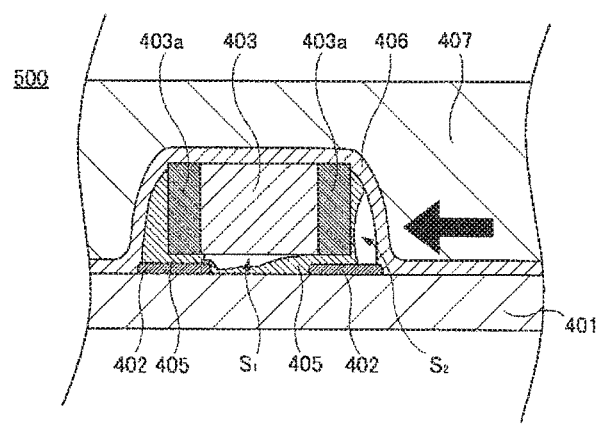

As shown in FIGS. 5A and 5B, in an electronic component-containing module 200 according to a modification of a preferred embodiment of the present invention, for example, a film 6 may be interposed between a board 1, electronic components 3 and 4 mounted on the board 1, and a sealing resin 7. The materials used for the film 6 are not particularly limited, and may be made of, for example, a curable resin such as an epoxy resin or a polyimide resin or a thermoplastic resin such as polyphenylene sulfide. The film 6 may have a single-layer structure or a multilayer structure including a plurality of layers.

The film 6 can be structured such that the curable resin is attached over the board 1 and the electronic components 3 and 4, which are mounted on the board 1, by, for example, a process, such as vacuum laminating, rubber pressing, or isostatic pressing, capable of following a complicated surface shape and is subsequently cured by a process, such as heat curing or light curing.

Where the film 6 is interposed between the board 1, the electronic components 3 and 4, which are mounted on the board 1, and the sealing resin 7, the sealing resin 7 does not flow therebetween during manufacture and, therefore, spaces S1 are readily provided between the board 1 and the electronic components 3 and 4.

In order to confirm the effectiveness of preferred embodiments of the present invention, experiments below were performed. First, 222 samples according to each of Examples 1 and 2 and Comparative Examples 1 and 2 were prepared.

Each sample has a structure in which an electronic component 3-mounted portion is extracted from the electronic component-containing module 100, according to a preferred embodiment of the present invention, shown in FIGS. 2A and 2B. That is, in the sample, terminal electrodes 3a of an electronic component 3 are fixed to land electrodes 2 provided on a board 1 with solder 5. The electronic component 3 is covered by a film 6. Furthermore, the film 6 is covered by a sealing resin 7. Thus, the sample includes a single electronic component. A space S1 is provided between the board 1 and the electronic component 3.

The distance between a pair of the land electrodes 2 formed on the board 1 was about 0.2 mm.

The electronic component 3 was an SMD component having a height of about 0.3 mm, a width of about 0.3 mm, and a length of about 0.6 mm.

The solder 5 was one having a re-melting temperature of about 220° C.

The film 6 had a thickness of about 20 μm and was made of an epoxy resin with a dryness factor of about 85%.

The sealing resin 7 was an epoxy resin including a filler made of $SiO_2$ and was varied in dryness factor in Examples 1 and 2 and Comparative Examples 1 and 2. The dryness factor was adjusted by varying the content of the filler or the maximum particle size of the filler. The thickness of the sealing resin 7 was constant at about 0.75 mm, in Examples 1 and 2 and Comparative Examples 1 and 2.

The dryness factor of the sealing resin 7 was about 85% in Example 1, about 60% in Example 2, about 58% in Comparative Example 1, and about 38% in Comparative Example 2.

Table 1 shows the number of samples in which solder flash occurred among the 222 samples. The occurrence of solder flash was confirmed by disassembling each sample.

TABLE 1

| Sample | Example 1 | Example 2 | Comparative Example 1 | Comparative Example 2 |
|---|---|---|---|---|
| Solder flash | 85% | 60% | 58% | 38% |
| Number of samples in which solder flash occurred (among 222 samples) | 0 | 0 | 14 | 84 |

In Examples 1 and 2, no solder flash occurred. However, in Comparative Example 1, solder flash occurred in 14 of the 222 samples and in Comparative Example 2, solder flash occurred in 84 of the 222 samples.

From the above, it is clear that preferred embodiments of the present invention are effective in preventing solder flash from occurring in an inner portion and in preventing electrical shorting or electrical discontinuity from occurring even though an electronic component-containing module is heated when the electronic component-containing module is mounted on a board or other substrate of an electronic device using solder or other substrate.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component-containing module comprising:
   a board;
   land electrodes provided on at least one principal surface of the board;
   an electronic component that includes terminal electrodes and is mounted on the at least one principal surface of the board such that the terminal electrodes are fixed to the land electrodes with a brazing filler metal; and
   a sealing resin provided on the at least one principal surface of the board to cover the electronic component; wherein
   the electronic component-containing module includes a space provided between the board and the electronic component;
   where after the electronic component-containing module is moisturized, the electronic component-containing module is heated to the re-melting temperature of the brazing filler metal, a dryness factor of the sealing resin is about 60% or more; and
   the dryness factor of the sealing resin is determined by $((W2-W3)/(W2-W1))\times100(\%)$, wherein
   W1 is a mass of a sample of the sealing resin before the electronic component-containing module is moisturized,
   W2 is a mass of the sample of the sealing resin after the electronic component-containing module is moisturized, and
   W3 is a mass of the sample of the sealing resin after being heated to the re-melting temperature.

2. The electronic component-containing module according to claim 1, wherein the brazing filler metal is solder.

3. The electronic component-containing module according to claim 1, wherein the electronic component is at least one of a capacitor element, a coil element, a resistance element, a piezoelectric element, a semiconductor element, and an integrated circuit element.

4. The electronic component-containing module according to claim 1, wherein the electronic component and the board are covered by a film and the film is covered by the sealing resin.

5. The electronic component-containing module according to claim 1, wherein the sealing resin includes a filler, and a content of the filler in the sealing resin is about 84% by weight or more.

6. The electronic component-containing module according to claim 1, wherein the sealing resin includes a filler, and the filler has a particle size φ of about 100 μm or more.

7. The electronic component-containing module according to claim 1, wherein the board is made of resin or ceramic.

8. The electronic component-containing module according to claim 1, wherein the board has a multilayer structure.

9. The electronic component-containing module according to claim 1, wherein the land electrodes are made of copper or aluminum.

10. The electronic component-containing module according to claim 1, wherein a plurality of the electronic components are mounted on the land electrodes.

11. The electronic component-containing module according to claim 1, wherein the sealing resin is a curable resin.

12. The electronic component-containing module according to claim 11, wherein the curable resin is one of an epoxy resin or a polyimide resin.

13. The electronic component-containing module according to claim 1, wherein the sealing resin is a thermoplastic resin.

14. The electronic component-containing module according to claim 13, wherein the thermoplastic resin is polyphenylene sulfide.

15. The electronic component-containing module according to claim 1, wherein
the sealing resin includes a filler;
a content of the filler in the sealing resin is about 84% by weight or more; and
the sealing resin is porous.

16. The electronic component-containing module according to claim 1, wherein
the sealing resin includes a filler;
a content of the filler in the sealing resin is about 84% by weight or more; and
the filler is made of $SiO_2$.

17. The electronic component-containing module according to claim 1, wherein
the sealing resin includes a filler;
the filler has a particle size φ of about 100 μm or more; and
the sealing resin is porous.

18. The electronic component-containing module according to claim 1, wherein
the sealing resin includes a filler;
the filler has a particle size φ of about 100 μm or more; and
the filler is made of $SiO_2$.

19. An electronic component-containing module comprising:
a board;
land electrodes provided on at least one principal surface of the board;
an electronic component that includes terminal electrodes and is mounted on the at least one principal surface of the board such that the terminal electrodes are fixed to the land electrodes with a brazing filler metal; and
a sealing resin provided on the at least one principal surface of the board to cover the electronic component; wherein
the electronic component-containing module includes a space provided between the board and the electronic component;
where after the electronic component-containing module is moisturized, the electronic component-containing module is heated to the re-melting temperature of the brazing filler metal, a dryness factor of the sealing resin is about 60% or more;
the dryness factor of the sealing resin is determined by $((W2-W3)/(W2-W1))\times 100(\%)$, wherein
W1 is a mass of a sample of the sealing resin before the electronic component-containing module is moisturized,
W2 is a mass of the sample of the sealing resin after the electronic component-containing module is moisturized, and
W3 is a mass of the sample of the sealing resin after being heated to the re-melting temperature; and
the sealing resin includes a filler that is made of $SiO_2$.

* * * * *